US012685151B2

(12) United States Patent
Chen et al.

(10) Patent No.: US 12,685,151 B2
(45) Date of Patent: Jul. 14, 2026

(54) SEMICONDUCTOR DEVICE AND MANUFACTURING METHOD THEREFOR

(71) Applicant: HUAWEI TECHNOLOGIES CO., LTD., Guangdong (CN)

(72) Inventors: Dong Chen, Shanghai (CN); Jie Sun, Shanghai (CN); Zhixiong Zeng, Shanghai (CN)

(73) Assignee: Huawei Technologies Co., LTD., Shenzhen (CN)

( * ) Notice: Subject to any disclaimer, the term of this patent is extended or adjusted under 35 U.S.C. 154(b) by 703 days.

(21) Appl. No.: 17/732,120

(22) Filed: Apr. 28, 2022

(65) Prior Publication Data

US 2022/0254717 A1 Aug. 11, 2022

Related U.S. Application Data

(63) Continuation of application No. PCT/CN2019/113850, filed on Oct. 29, 2019.

(51) Int. Cl.
H10D 1/20 (2025.01)
H10D 1/68 (2025.01)
(Continued)

(52) U.S. Cl.
CPC ............ H10W 20/497 (2026.01); H10D 1/20 (2025.01); H10D 1/692 (2025.01); H10W 20/42 (2026.01);
(Continued)

(58) Field of Classification Search
CPC ...... H10D 1/20; H10D 1/692; H01L 23/5227;
H01L 23/5223; H01L 23/5225; H01L 23/5226; H01L 23/5286; H01L 23/66; H01L 23/5283; H01L 23/481; H10W 20/497; H10W 20/42; H10W 20/423; H10W 20/427; H10W 20/496;
(Continued)

(56) References Cited

U.S. PATENT DOCUMENTS 6,169,008 B1 * 1/2001 Wen ........................ H10D 84/00
257/E21.022
9,007,141 B2 * 4/2015 Steeneken .............. H01G 4/385
333/24 C
(Continued)

FOREIGN PATENT DOCUMENTS

CN 1485919 A 3/2004
CN 1694240 A 11/2005
(Continued)

OTHER PUBLICATIONS

Extended European Search Report issued in European Application No. 19950830.0 on Oct. 4, 2022, 7 pages.
(Continued)

*Primary Examiner* — Omar F Mojaddedi
(74) *Attorney, Agent, or Firm* — Fish & Richardson P.C.

(57) ABSTRACT

The disclosure provides manufacturing methods and semiconductor devices. One example method includes that a semiconductor device includes a substrate and an inductor, where a shield layer is formed between the substrate and the inductor, and the shield layer is used to shield an electrical coupling between the substrate and the inductor.

11 Claims, 10 Drawing Sheets

(51) Int. Cl.

| | | |
|---|---|---|
| *H10W 20/40* | (2026.01) | |
| *H10W 20/41* | (2026.01) | |
| *H10W 20/42* | (2026.01) | |
| *H10W 44/20* | (2026.01) | |

(52) U.S. Cl.

CPC ....... *H10W 20/423* (2026.01); *H10W 20/427* (2026.01); *H10W 20/496* (2026.01); *H10W 44/20* (2026.01); *H10W 20/435* (2026.01); *H10W 44/206* (2026.01); *H10W 44/209* (2026.01); *H10W 44/241* (2026.01)

(58) Field of Classification Search

CPC . H10W 20/435; H10W 44/20; H10W 44/206; H10W 44/209; H10W 44/241

See application file for complete search history.

(56) References Cited

U.S. PATENT DOCUMENTS

| | | | | |
|---|---|---|---|---|
| 9,583,554 | B1 * | 2/2017 | Ler | ......................... H10D 1/20 |
| 2003/0155617 | A1 | 8/2003 | Woo et al. | |
| 2009/0090995 | A1 * | 4/2009 | Yang | ...................... H10D 84/00 |
| | | | | 257/E29.166 |
| 2010/0295151 | A1 * | 11/2010 | Kurokawa | ............ H01L 23/481 |
| | | | | 257/E29.325 |

| | | | | |
|---|---|---|---|---|
| 2011/0076979 | A1 | 3/2011 | Wu et al. | |
| 2011/0156205 | A1 | 6/2011 | Maki et al. | |
| 2011/0316657 | A1 | 12/2011 | Park et al. | |
| 2012/0286391 | A1 | 11/2012 | Shen et al. | |
| 2020/0161252 | A1 * | 5/2020 | Yang | ..................... H10W 42/20 |

FOREIGN PATENT DOCUMENTS

| | | | | |
|---|---|---|---|---|
| CN | 1723513 | A | 1/2006 | |
| CN | 101312011 | A | 11/2008 | |
| CN | 101872744 | A | 10/2010 | |
| CN | 102446898 | A | 5/2012 | |
| CN | 103427865 | A | 12/2013 | |
| CN | 103956362 | A | 7/2014 | |
| CN | 106663670 | A | 5/2017 | |
| WO | WO-2004102665 | A1 * | 11/2004 | ......... H01L 23/5225 |

OTHER PUBLICATIONS

PCT International Search Report and Written Opinion issued in International Application No. PCT/CN2019/113850 on Jul. 27, 2020, 16 pages (with English translation).

Yu, "Research on high-power intelligent power supply technology based on USB TYPE-C protocol," China Doctoral Dissertation Full Text Database, Information Science and Technology Series, No. 9, p. 82, Paragraph 3, Sep. 15, 2018, 3 pages (with English translation).

\* cited by examiner

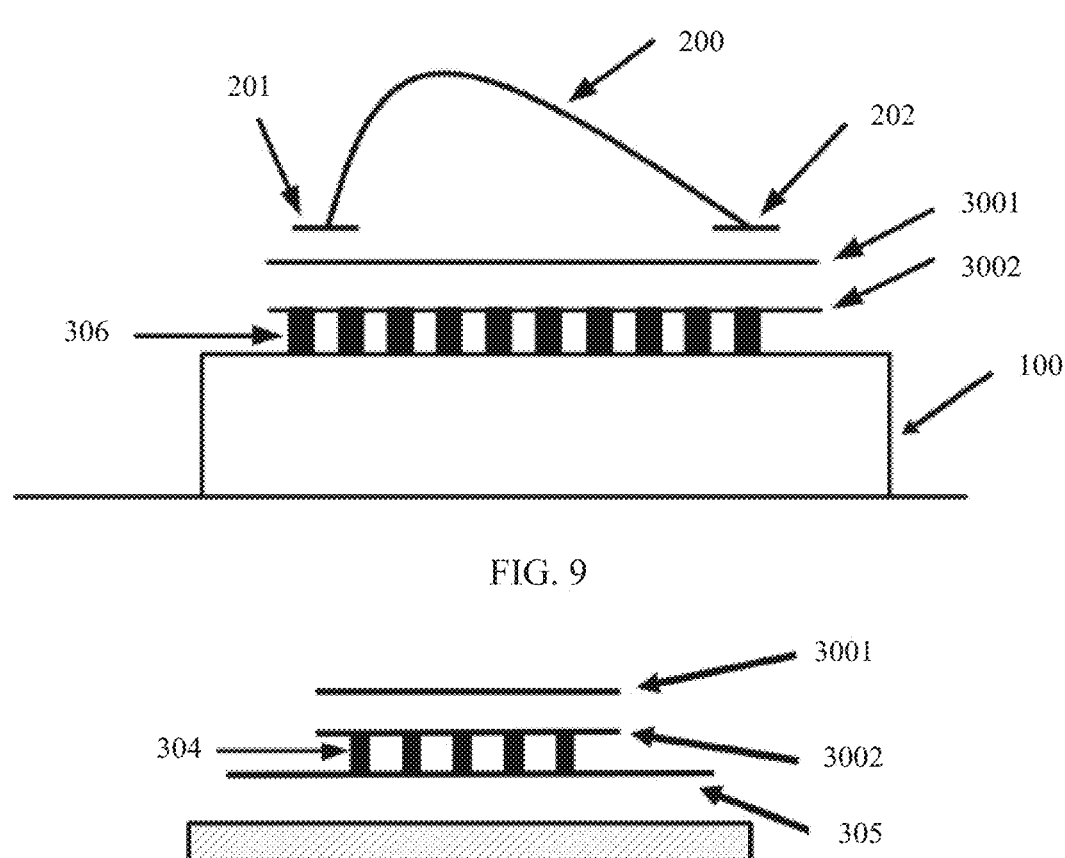
FIG. 9
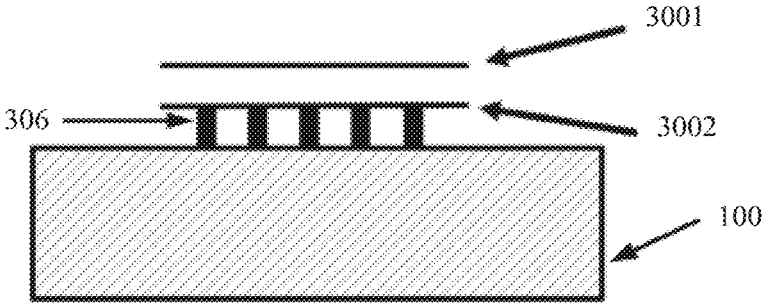
FIG. 10
FIG. 11

SEMICONDUCTOR DEVICE AND MANUFACTURING METHOD THEREFOR

CROSS-REFERENCE TO RELATED APPLICATIONS

This application is a continuation of International Application No. PCT/CN2019/113850, filed on Oct. 29, 2019, the disclosure of which is hereby incorporated by reference in its entirety.

TECHNICAL FIELD

This application relates to the field of semiconductor devices, and in particular, to a semiconductor device and a manufacturing method therefor.

BACKGROUND

With rapid progress and development of the semiconductor industry, integrating various components such as a resistor, a capacitor, and an inductor into a semiconductor process product becomes an inevitable trend.

Using a radio frequency integrated circuit (RF Circuits) as an example, to integrate a matching component in a conventional radio frequency circuit into a chip, an inductor needs to be manufactured in the chip, that is, the inductor is integrated on the chip. As a key component in the radio frequency integrated circuit, the inductor is difficult to design and grasp in the circuit, and a performance parameter of the inductor directly affects performance of the radio frequency integrated circuit. The on-chip inductor is characterized by a low cost, easy integration, low noise, and low power consumption. More importantly, the on-chip inductor is compatible with a modern CMOS process. Therefore, on-chip inductors are widely applied.

The on-chip inductor may be a bonding wire (Bonding wire) connecting different conductive ports, or may be a planar inductor (planar inductor) formed on a semiconductor substrate and having a layered structure. However, because the on-chip inductor is formed on the substrate, there is an electrical coupling between the inductor and the substrate, and a current in the inductor causes a coupling current formed on the substrate. Consequently, a quality factor of the inductor is reduced, an energy loss is caused in the semiconductor device, and performance of the semiconductor device is affected. Therefore, improving the quality factor of the on-chip inductor plays an important role in improving the performance of the semiconductor device.

SUMMARY

In view of this, this application provides a semiconductor device and a manufacturing method therefor, to reduce a coupling current in a substrate and improve performance of the semiconductor device.

According to a first aspect, an embodiment of this application provides a semiconductor device, including:

a substrate and an inductor, where a shield layer is formed between the substrate and the inductor, and the shield layer is used to shield an electrical coupling between the substrate and the inductor.

In this embodiment of this application, the shield layer may be used to shield the electrical coupling between the substrate and the inductor. In this way, a coupling current in the substrate can be reduced, a quality factor of the inductor is improved, and performance of the device is improved.

In some possible implementations, the shield layer is grounded.

In this embodiment of this application, the shield layer may be grounded. In this way, a relatively optimal shielding function can be implemented for the substrate and the inductor, the coupling current in the substrate is reduced, the quality factor of the inductor is improved, and performance of the device is improved.

In some possible implementations, the shield layer is grounded by using a bonding wire, or the shield layer is grounded by using conductive through holes that pass through the substrate, or the shield layer is connected to the grounded substrate to achieve grounding.

In this embodiment of this application, grounding of the shield layer may be implemented in a plurality of manners. In this way, reliable shielding is provided.

In some possible implementations, the shield layer is another functional layer in the semiconductor device.

In this embodiment of this application, another functional layer in the semiconductor device may be used as the shield layer, and there is no need to provide a shield layer additionally. In this way, a performance process of the semiconductor device is simplified, and redundant components in the semiconductor device are reduced.

In some possible implementations, the shield layer is an on-chip capacitor.

In this embodiment of this application, the on-chip capacitor may be used as the shield layer, thereby improving shielding reliability to some extent.

In some possible implementations, the on-chip capacitor has a first electrode plate and a second electrode plate, the second electrode plate is grounded by using conductive through holes, and an area of the second electrode plate is larger than an area of the first electrode plate.

In this embodiment of this application, the capacitor may be provided with an asymmetric structure. In this way, a quality factor of the capacitor can be improved, and performance of the device is further improved.

In some possible implementations, in the substrate, a doping density of a region directly facing the inductor is lower than a doping density of another region.

In this embodiment of this application, the doping density of the substrate region directly facing the inductor may be reduced. In this way, a resistivity in the region is increased, a coupling current in the region is reduced, and the quality factor of the inductor is further improved.

In some possible implementations, in the substrate, a thickness of the region directly facing the inductor is less than a thickness of the another region.

In this embodiment of this application, the thickness of the substrate region directly facing the inductor may be reduced. In this way, the resistivity in the region is increased, the coupling current in the region is reduced, and the quality factor of the inductor is further improved.

In some possible implementations, the inductor is a bonding wire connecting a signal input end and a signal output end, or a conductor layer connecting the signal input end and the signal output end.

In this embodiment of this application, the inductor may be the bonding wire or the conductor layer, and has particular reliability.

According to a second aspect, an embodiment of this application provides another semiconductor device, including:

a substrate and an inductor, where in the substrate, a doping density of a region directly facing the inductor is lower than a doping density of another region; and/or in the substrate, a thickness of the region directly facing the inductor is less than a thickness of the another region.

According to a third aspect, an embodiment of this application provides still another semiconductor device, including:

a substrate and a capacitor, where the capacitor has a first electrode plate and a second electrode plate, the second electrode plate is grounded, and an area of the second electrode plate is larger than an area of the first electrode plate.

According to a fourth aspect, an embodiment of this application provides a method for manufacturing a semiconductor device, where the method includes:

providing a substrate; and sequentially forming a shield layer and an inductor on the substrate, where the shield layer is used to shield an electrical coupling between the substrate and the inductor.

In some possible implementations, the shield layer is grounded.

In some possible implementations, the shield layer is grounded by using a bonding wire, or the shield layer is grounded by using conductive through holes that pass through the substrate, or the shield layer is connected to the grounded substrate to achieve grounding.

In some possible implementations, the shield layer is another functional layer in the semiconductor device.

In some possible implementations, the shield layer is an on-chip capacitor.

In some possible implementations, the on-chip capacitor has a first electrode plate and a second electrode plate, the second electrode plate is grounded by using conductive through holes, and an area of the second electrode plate is larger than an area of the first electrode plate.

In some possible implementations, in the substrate, a doping density of a region directly facing the inductor is lower than a doping density of another region.

In some possible implementations, in the substrate, a thickness of the region directly facing the inductor is less than a thickness of the another region.

In some possible implementations, the inductor is a bonding wire connecting a signal input end and a signal output end, or a conductor layer connecting the signal input end and the signal output end.

According to a fifth aspect, an embodiment of this application provides another method for manufacturing a semiconductor device, where the method includes:

providing a substrate, where in the substrate, a doping density of a region directly facing an inductor is lower than a doping density of another region, and/or in the substrate, a thickness of the region directly facing the inductor is less than a thickness of the another region; and forming the inductor on the substrate.

According to a sixth aspect, an embodiment of this application provides a still another method for manufacturing a semiconductor device, where the method includes:

providing a substrate; and forming a capacitor on the substrate, where the capacitor has a first electrode plate and a second electrode plate, the second electrode plate is grounded, and an area of the second electrode plate is larger than an area of the first electrode plate.

Compared with a conventional technology, this application has the following beneficial effects.

As can be learned from the foregoing technical solutions, the semiconductor device provided in this application includes the substrate and the inductor, where the shield layer may be formed between the substrate and the inductor, and the shield layer is used to shield the electrical coupling between the substrate and the inductor. In this way, the coupling current in the substrate can be reduced, an energy loss in the inductor is reduced, the quality factor of the inductor is improved, and performance of the semiconductor device is improved.

BRIEF DESCRIPTION OF DRAWINGS

To clearly understand specific implementations of this application, the following briefly describes accompanying drawings used for describing the specific implementations of this application. It is clear that the accompanying drawings show merely some embodiments of this application.

FIG. 9 is a schematic diagram of a structure of still another semiconductor device according to an embodiment of this application;

FIG. 10 is a schematic diagram of a structure of still another semiconductor device according to an embodiment of this application;

FIG. 11 is a schematic diagram of a structure of still another semiconductor device according to an embodiment of this application;

DESCRIPTION OF EMBODIMENTS

In view of this, this application provides a semiconductor device and a manufacturing method therefor, to reduce a coupling current in a substrate and improve performance of the semiconductor device.

Currently, a resistor, a capacitor, and an inductor may be integrated into a semiconductor process product. Using a radio frequency integrated circuit as an example, to integrate a matching component in a conventional radio frequency circuit into a chip, an inductor needs to be manufactured on the chip, that is, the inductor is integrated on the chip. As a key component in the radio frequency integrated circuit, the inductor is difficult to design and grasp in the circuit, and a performance parameter of the inductor directly affects performance of the radio frequency integrated circuit. The on-chip inductor is characterized by a low cost, easy integration, low noise, and low power consumption. More importantly, the on-chip inductor is compatible with a modern CMOS process. Therefore, on-chip inductors are widely applied.

Figure 1:
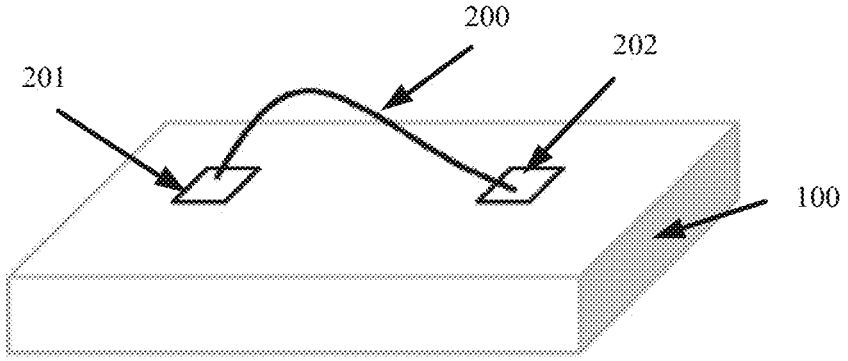
FIG. 1 is a schematic diagram of a structure of a semiconductor device according to an embodiment of this application.

The on-chip inductor may be a bonding wire connecting different conductive ports, or may be a planar inductor having a layered structure. The on-chip inductor is usually formed on a semiconductor substrate. FIG. 1 is a schematic diagram of a structure of a semiconductor device according to an embodiment of this application. A bonding wire is used as an inductor 200 in the semiconductor device, one end of the bonding wire is connected to a signal input end, and the other end is connected to a signal output end. The signal input end and the signal output end may be connection ends of other components on a semiconductor substrate 100.

A distance between the inductor 200 formed on the semiconductor substrate 100 and the substrate 100 is relatively short. Therefore, due to adverse impact of a current in the inductor 200, a coupling current is formed on the substrate 100. Consequently, an energy loss is caused in the semiconductor device, performance of the semiconductor device is affected, and a quality factor of the inductor 200 is reduced. The quality factor of the inductor may be defined as a ratio of energy stored in the inductor to energy lost in each oscillation period. If the quality factor of the inductor is higher, the loss of the inductor is lower, and efficiency is higher.

Figure 2:
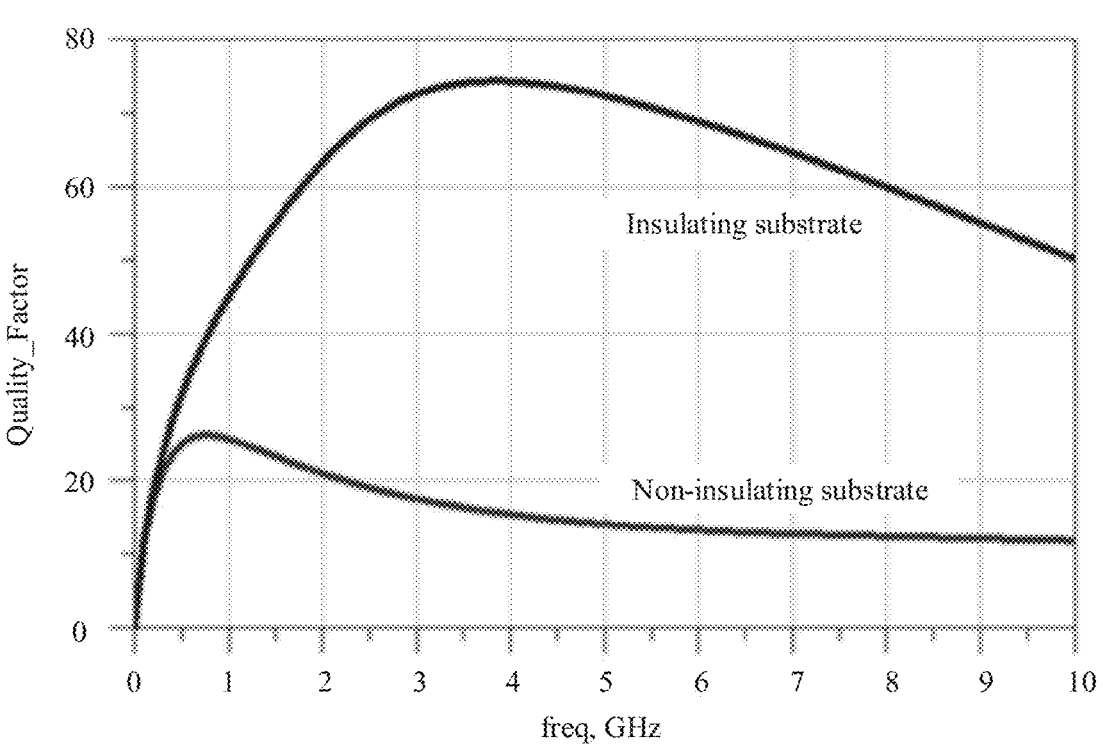
FIG. 2 is a schematic diagram of a quality factor of an inductor according to an embodiment of this application.

Assuming that the semiconductor device is a laterally-diffused metal-oxide semiconductor (laterally-diffused metal-oxide semiconductor, LDMOS), the LDMOS device includes an inductor, and the LDMOS device may have an insulating substrate or may have a non-insulating substrate. FIG. 2 is a schematic diagram of a quality factor of an inductor according to an embodiment of this application, including a comparison between a quality factor of the inductor on an insulating substrate and a quality factor of the inductor on a non-insulating substrate, where a horizontal coordinate is a frequency (frequency, freq) in units of GHz, and a vertical coordinate is the quality factor (Quality_Factor) of the inductor in dimensionless units. It can be learned that the quality factor of the inductor is clearly reduced due to a coupling current in the non-insulated substrate. Therefore, performance of the LDMOS device is also degraded. Therefore, improving the quality factor of the on-chip inductor plays an important role in improving performance of the semiconductor device.

Based on the foregoing technical problem, embodiments of this application provide a semiconductor device and a manufacturing method therefor. The semiconductor device includes a substrate and an inductor, where a shield layer may be formed between the substrate and the inductor, and the shield layer is used to shield an electrical coupling between the substrate and the inductor. In this way, a coupling current in the substrate can be reduced, an energy loss in the inductor is reduced, a quality factor of the inductor is improved, and performance of the semiconductor device is improved.

With reference to the accompanying drawings, the following describes in detail the semiconductor device provided in this application, to make specific implementations of this application more comprehensible.

Figures 3, 4:
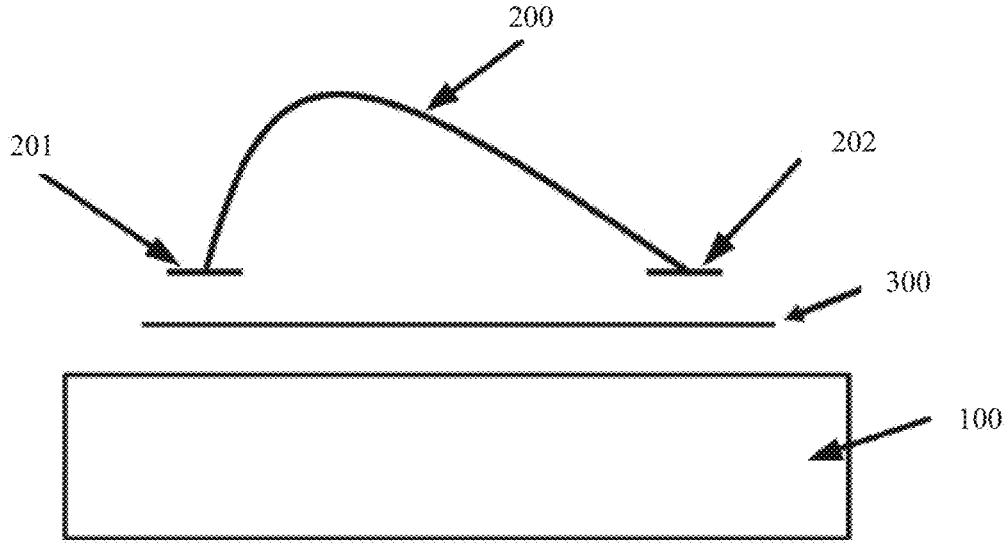
FIG. 3 is a schematic diagram of a structure of another semiconductor device according to an embodiment of this application.
FIG. 4 is a schematic diagram of a structure of still another semiconductor device according to an embodiment of this application.

FIG. 3 is a schematic diagram of a structure of another semiconductor device according to an embodiment of this application. The semiconductor device provided in this embodiment of this application may include a substrate 100 and an inductor 200, where a shield layer (Shield) 300 may be formed between the substrate 100 and the inductor 200, and the shield layer 300 may shield an electrical coupling between the substrate 100 and the inductor 200.

The substrate 100 may be a semiconductor substrate, for example, a Si substrate, a Ge substrate, a SiGe substrate, a SOI (silicon on insulator, Silicon On Insulator), or a GOI (germanium on insulator, Germanium On Insulator). Certainly, in other embodiments, the substrate 100 may alternatively be a substrate including other element semiconductors or compound semiconductors, such as GaAs, InP, or SiC, or may be a laminated structure, such as Si/SiGe, or may be another epitaxial structure, such as SGOI (silicon germanium on insulator). An isolation region (not shown in the figure) may be formed on the substrate 100. The isolation region may include silicon dioxide or other materials that can separate active regions of the device. In this embodiment, the substrate 100 is a bulk silicon substrate.

The inductor 200 may be formed on the substrate 100. One end of the inductor 200 is connected to a signal input end 201, and the other end is connected to a signal output end 202. The signal input end 201 and the signal output end 202 may be disposed at a same metal layer, or may be disposed at different metal layers.

Optionally, the inductor 200 may be a bonding wire connecting different conductive ports. For example, the inductor 200 may be connected to the signal input end 201 and the signal output end 202. The bonding wire may be a copper wire, a gold wire, an aluminum wire, or the like, or may be another conductive metal wire. The bonding wire usually has a particular length and arc, which determines an inductance value of the bonding wire. A material and diameter of the bonding wire also affect a quality factor of the bonding wire.

Optionally, the inductor 200 may alternatively be a conductor layer with a layered structure. The conductor layer may be connected to the signal input end 201 and the signal output end 202 respectively by using conductive through holes, to form a structure of the inductor 200. The conductor layer may be a metal layer, for example, a tungsten metal layer or a copper metal layer. The conductive through holes may be through holes in which metal materials are formed.

The shield layer 300 may be formed between the substrate 100 and the inductor 200, and the shield layer 300 may isolate the inductor 200 from the substrate 100, thereby shielding the electrical coupling between the substrate 100 and the inductor 200. In this way, a coupling current in the substrate 100 is reduced, a quality factor of the inductor 200 is improved, an energy loss in the semiconductor device is reduced, and performance of the semiconductor device is improved.

Figures 5, 6:
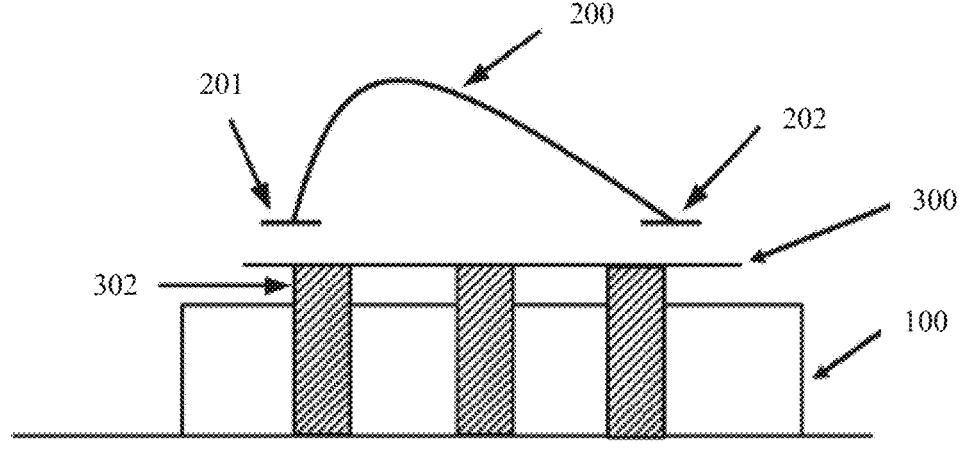
FIG. 5 is a schematic diagram of a structure of still another semiconductor device according to an embodiment of this application.
FIG. 6 is a schematic diagram of a structure of still another semiconductor device according to an embodiment of this application.

In a possible implementation, the shield layer 300 may be a grounded conductor layer or semiconductor layer. The conductor layer may be a metal layer, such as a tungsten metal layer or a copper metal layer. The semiconductor layer may be a laminate of one or more layers of a Si material layer, a Ge material layer, a SiGe material layer, or the like. The shield layer 300 may be grounded in a plurality of manners. FIG. 4, FIG. 5, and FIG. 6 are schematic diagrams of a semiconductor device provided in this embodiment of this application. Referring to FIG. 4, a shield layer 300 may be grounded by using a bonding wire 301. Referring to FIG. 5, a shield layer 300 may be connected to a ground wire for grounding by using conductive through holes 302 that pass through a substrate 100. Referring to FIG. 6, a shield layer 300 may be connected to a grounded substrate 100 for grounding by using conductive through holes 303.

Figure 7:
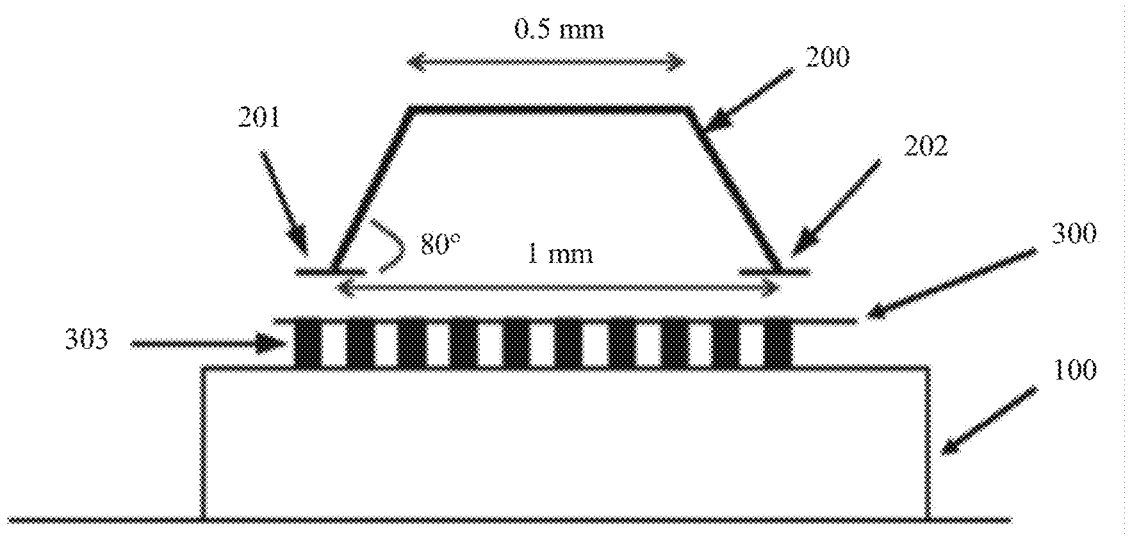
FIG. 7 is a schematic diagram of a structure of still another semiconductor device according to an embodiment of this application.
Figure 8:
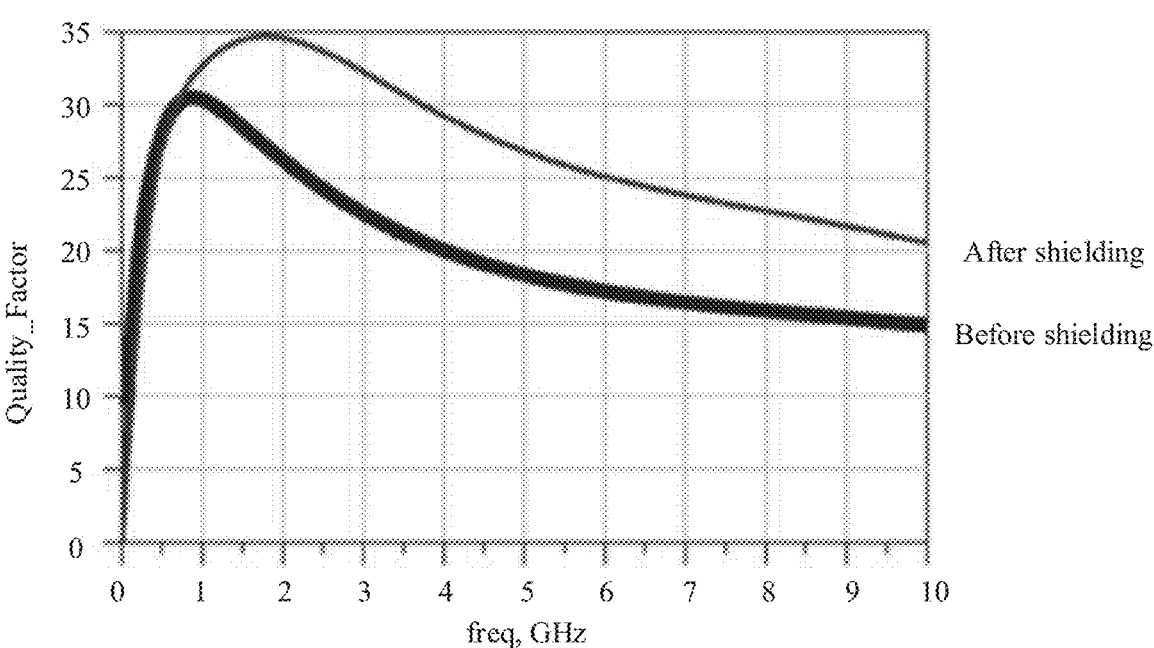
FIG. 8 is a schematic diagram of a quality factor of another inductor according to an embodiment of this application.

For example, a form of an inductor 200 in FIG. 6 is equivalent. FIG. 7 is a schematic diagram of still another semiconductor device according to an embodiment of this application, where a shield layer 300 may be connected to a grounded substrate 100 for grounding, a distance between one end of an inductor 200 and the other end of the inductor 200 is 1 mm, an included angle between an end line segment of the inductor 200 and a surface of the substrate 100 is 80°, a length of a line segment of the inductor 200 that is parallel to the surface of the substrate 100 is about 0.5 mm, the substrate 100 is a highly conductive substrate, and a resistivity is 0.015 f cm. FIG. 8 is a schematic diagram of a quality factor of another inductor according to an embodiment of this application, including a comparison between a quality factor of the inductor 2(*x*) under a condition that the grounded shield layer 300 is disposed and a quality factor of the inductor 200 under a condition that the grounded shield layer 300 is not disposed, where a horizontal coordinate is a frequency (frequency, freq) in units of GHz, and a vertical coordinate is the quality factor (Quality_Factor) of the inductor 200 in dimensionless units. It can be learned that after the grounded shield layer 300 is used, the quality factor of the inductor 200 is effectively improved.

In another possible implementation, the shield layer 300 may alternatively be another functional layer on the substrate 100, and the another functional layer may be electrically connected to the inductor 200, or may not be electrically connected to the inductor 200. The another functional layer may be, for example, a capacitor formed on the substrate 100. The capacitor may be a plate capacitor. The capacitor has a first electrode plate and a second electrode plate. The second electrode plate may be grounded. The substrate 100 may be close to the first electrode plate, or may be close to the second electrode plate. The second electrode plate may be connected to a ground wire for grounding by using conductive through holes, or may be connected to the grounded substrate for grounding by using conductive through holes. FIG. 9 is a schematic diagram of still another semiconductor device according to an embodiment of this application. A capacitor may include a first electrode plate and a second electrode plate. The first electrode plate of the capacitor is an upper electrode plate 3001, and the second electrode plate of the capacitor is a lower electrode plate 3002. The lower electrode plate 3002 may be connected to a substrate 100 by using conductive through holes 306, and the substrate 100 may be grounded, so that the second electrode plate is grounded.

In this embodiment of this application, the capacitor may isolate an inductor 200 from the substrate 100. In this way, an electrical coupling between the substrate 100 and the inductor 200 is shielded, a coupling current in the substrate 100 is reduced, a quality factor of the inductor 200 is improved, an energy loss of the semiconductor device is reduced, and performance of the semiconductor device is improved.

The following describes a quality factor of the capacitor formed on the substrate 100. The capacitor formed on the substrate 100 may also be referred to as an on-chip capacitor. FIG. 10 is a schematic diagram of a structure of still another semiconductor device according to an embodiment of this application, where the semiconductor device includes a substrate 100 and a capacitor on the substrate 100, and a lower electrode plate 3002 of the capacitor is connected to a ground wire 305 by using conductive through holes 304. FIG. 11 is a schematic diagram of a semiconductor device according to an embodiment of this application, where semiconductor device includes a substrate 100 and a capacitor on the substrate 100, and a lower electrode plate 3002 of the capacitor is connected to the grounded substrate 100 by using conductive through holes 306.

Figure 12:
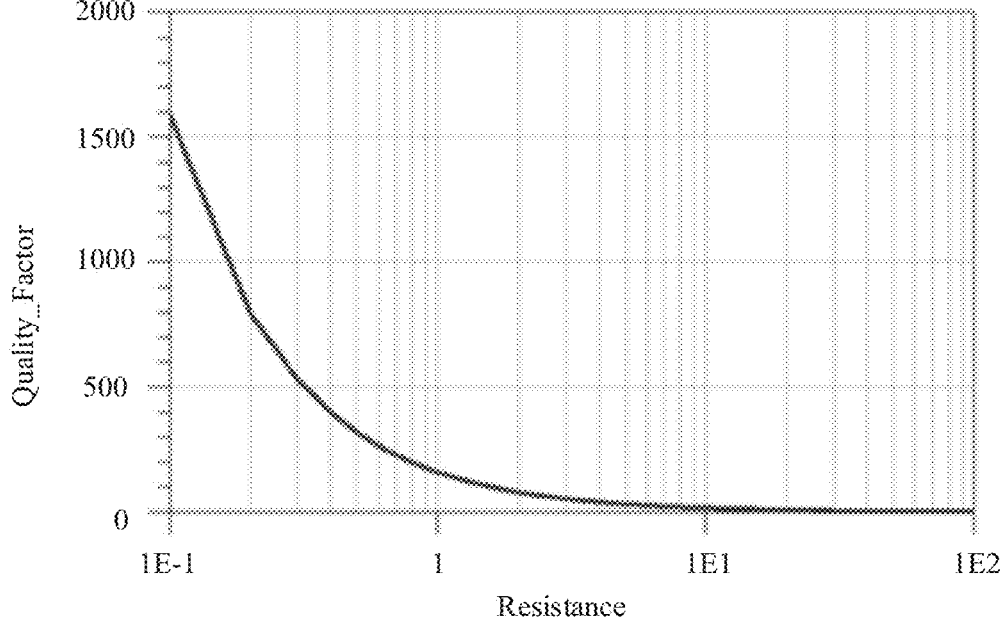
FIG. 12 is a schematic diagram of a quality factor of a capacitor according to an embodiment of this application.

Because the lower electrode plate 3002 of the capacitor is grounded by using the conductive through holes, resistance of the conductive through holes causes an energy loss. As a result, a quality factor of the capacitor is reduced, and performance of the semiconductor device is also degraded. Therefore, improving the quality factor of the capacitor can reduce the energy loss in the semiconductor device and also improve the performance of the semiconductor device. FIG. 12 is a schematic diagram of a quality factor of a capacitor according to an embodiment of this application, where a horizontal coordinate is a resistance (Resistance) value of grounded conductive through holes in units of ohms, and a vertical coordinate is the quality factor of the capacitor connected to the grounded conductive through holes in dimensionless units. It can be learned that, as the resistance value of the grounded conductive through holes is increased, the quality factor of the capacitor is clearly reduced, causing great impact on performance of the semiconductor.

Figure 13:
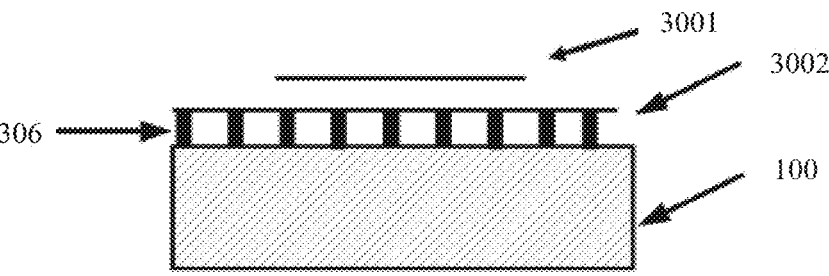
FIG. 13 is a schematic diagram of a structure of still another semiconductor device according to an embodiment of this application.
Figure 14:
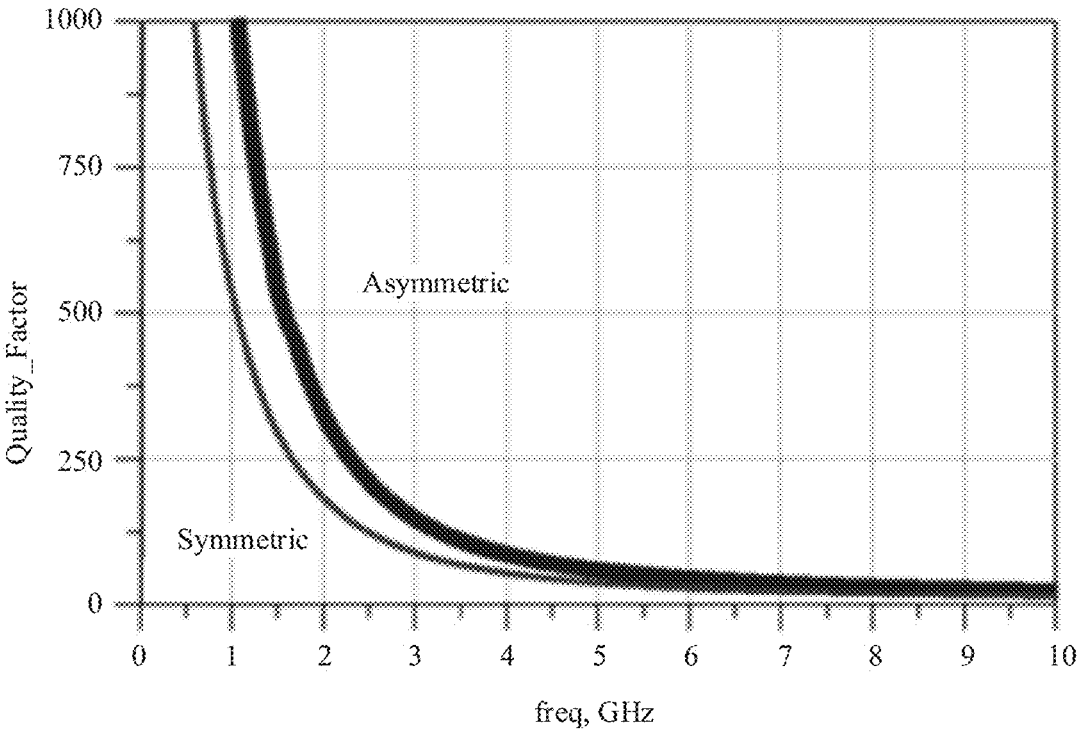
FIG. 14 is a schematic diagram of a quality factor of another capacitor according to an embodiment of this application.

Therefore, in this embodiment of this application, the on-chip capacitor may be in a form of asymmetric capacitor plates. When an area of the grounded lower electrode plate 3002 is greater than an area of the upper electrode plate 3001, the lower electrode plate 3002 can be connected to more conductive through holes. Therefore, equivalent resistance obtained by parallel connection of a plurality of conductive through holes is reduced, an energy loss in the conductive through holes is reduced to some extent, and the quality factor of the capacitor is improved. FIG. 13 is a schematic diagram of still another semiconductor device according to an embodiment of this application, where an area of an upper electrode plate 3001 of an asymmetric capacitor is 0.2 mm$^2$, and an area of a lower electrode plate 3002 is 0.8 mm$^2$. FIG. 14 is a schematic diagram of a quality factor of another capacitor according to an embodiment of this application, including a comparison between a quality factor of a symmetric capacitor and a quality factor of an asymmetric capacitor. For parameters of the asymmetric capacitor, refer to FIG. 13. An area of an upper electrode plate 3001 and an area of a lower electrode plate 3002 of the symmetric capacitor are both 0.2 mm². In FIG. 14, a horizontal coordinate is a resistance (Resistance) value of grounded conductive through holes in units of ohms, and a vertical coordinate is the quality factor of the capacitor connected to the grounded conductive through holes in dimensionless units. It can be learned that the asymmetric capacitor has a higher quality factor.

Figure 15:
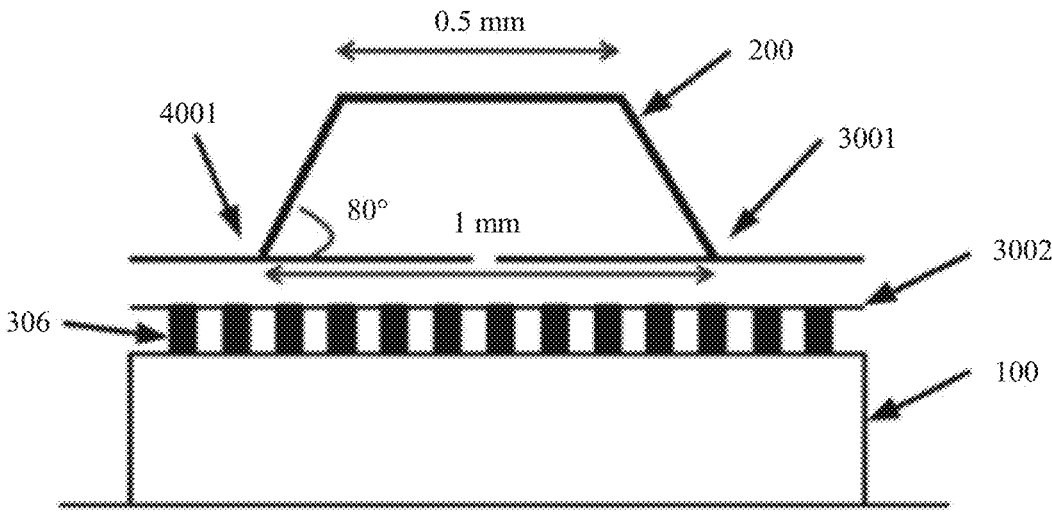
FIG. 15 is a schematic diagram of a structure of still another semiconductor device according to an embodiment of this application.
Figure 16:
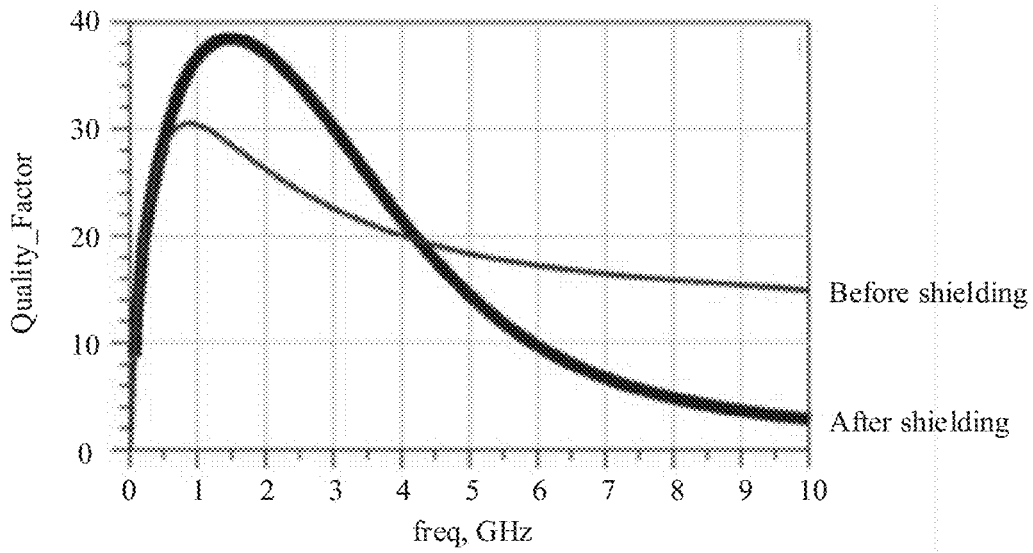
FIG. 16 is a schematic diagram of a quality factor of still another inductor according to an embodiment of this application.

Based on the foregoing analysis, the asymmetric capacitor can be used to improve the quality factor of the capacitor. Therefore, when the capacitor is used as a shield layer 300, to further improve performance of the semiconductor device, the capacitor used as the shield layer 300 may be adjusted to an asymmetric structure. FIG. 15 is a schematic diagram of a structure of still another semiconductor device according to an embodiment of this application. The semiconductor device includes a substrate 100, an inductor 200, and capacitors between the substrate 100 and the inductor 200. One end of the inductor 200 is connected to an upper electrode plate 4001 of a first capacitor. The other end of the inductor 200 is connected to an upper electrode plate 3001 of a second capacitor. The first capacitor and the second capacitor have a common grounded lower electrode plate 3002. Therefore, the two capacitors and the inductor 200 form a π-shaped circuit. In an example, a distance between one end of the inductor 200 and the other end of the inductor 200 is 1 mm, an included angle between one end of the inductor 200 and a surface of the substrate 100 is 80°, and a line segment of the inductor 200 that is parallel to the surface of the substrate 100 is about 0.5 mm. FIG. 16 is a schematic diagram of a quality factor of still another inductor according to an embodiment of this application, including a comparison between a quality factor of the inductor 200 under a condition that a capacitor is used as the shield layer 300 and a quality factor of the inductor 200 under a condition that no capacitor is used as the shield layer 3X), where a horizontal coordinate is a frequency (frequency, freq) in units of GHz, and a vertical coordinate is the quality factor (Quality_Factor) of the inductor 200 in dimensionless units. It can be learned that after isolation by the capacitor, the quality factor of the inductor 200 in some frequency bands is effectively improved.

In this embodiment of this application, performance of the semiconductor device is degraded because the quality factor of the inductor 200 is reduced, and the quality factor of the inductor 200 is reduced because a coupling current is generated in the substrate 100. If the coupling current is larger, the quality factor of the inductor 200 is lower. Therefore, the quality factor of the inductor 200 can also be improved by reducing the coupling current in the substrate 100. The coupling current in the substrate 100 is related to a resistivity of the substrate 100. Therefore, the coupling current in the substrate 100 can be reduced by increasing the resistivity of the substrate 100. In this way, an energy loss is reduced, the quality factor of the inductor 200 is improved, and performance of the semiconductor device is improved.

In a possible implementation, the resistivity of the substrate may be adjusted by changing a doping status of the substrate 100. Specifically, in the substrate 100, a doping density of a region 1001 directly facing the inductor 200 may be lower than a doping density of another region 1002. Therefore, a resistivity of the region 1001 directly facing the inductor 200 is increased, and the coupling current that can be generated is reduced. In this way, the quality factor of the inductor 200 can be improved, and performance of the semiconductor device is improved, while the another region does not directly face the inductor 200 and no coupling current is generated. Therefore, a relatively high doping density can ensure normal working of the semiconductor substrate.

Figure 17:
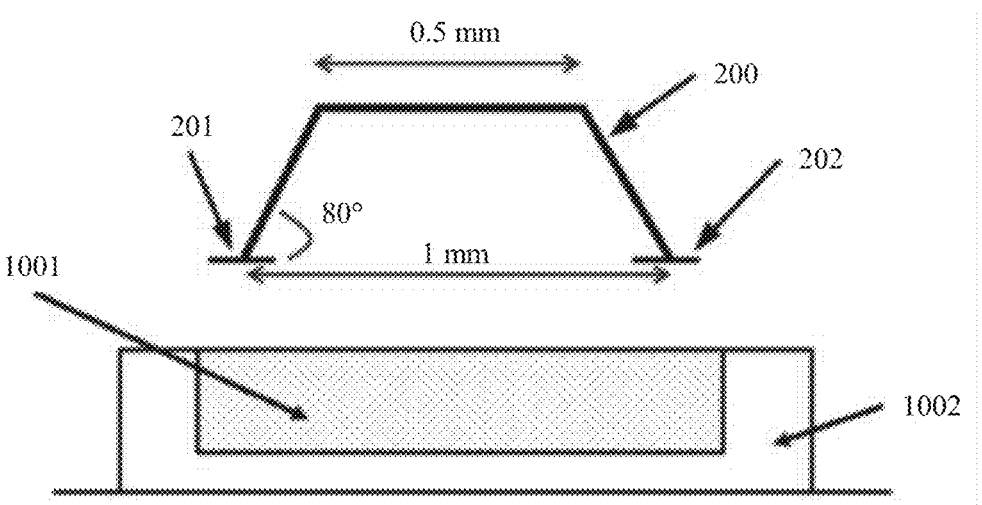
FIG. 17 is a schematic diagram of a structure of still another semiconductor device according to an embodiment of this application.
Figure 18:
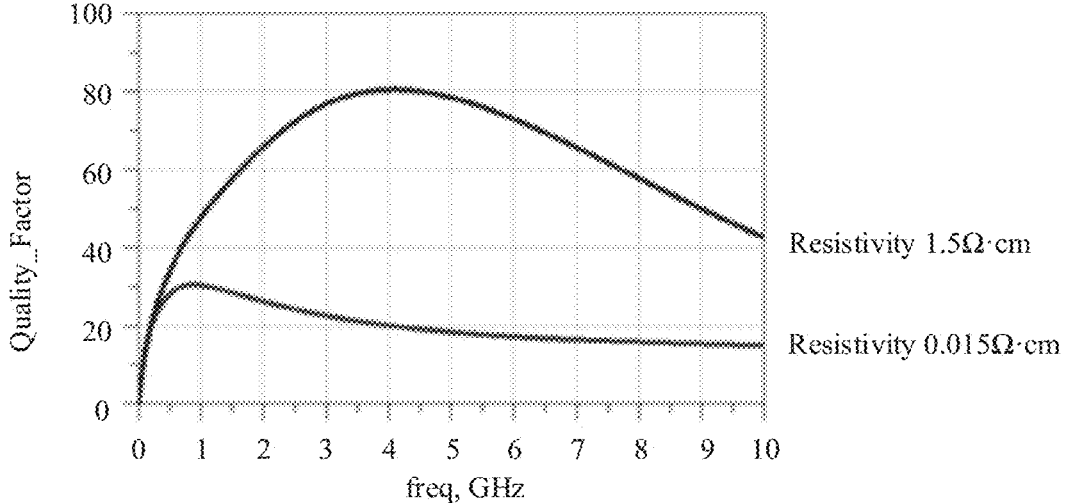
FIG. 18 is a schematic diagram of a quality factor of still another inductor according to an embodiment of this application.

FIG. 17 is a schematic diagram of a structure of still another semiconductor device according to an embodiment of this application. The semiconductor device includes a substrate 100 and an inductor 200. In the substrate 100, a region directly facing an inductor 200 may be a lightly doped region 1001, a substrate resistivity of the lightly doped region 1001 may be 1.5 Ω·cm, an area of the lightly doped region 1001 may be determined based on a directly faced area of the inductor 200, and a depth of the lightly doped region 1001 may be determined based on a feature of the inductor 200 and a distance between the inductor 200 and the substrate. A heavily doped active region 1002 is outside the lightly doped region 1001, and a substrate resistivity of the heavily doped active region 1002 may be 0.015 Ω·cm. FIG. 18 is a schematic diagram of a quality factor of still another inductor according to an embodiment of this application, including a comparison between a quality factor of the inductor 200 under a condition that the substrate 100 is partially lightly doped and a quality factor of the inductor 200 under a condition that the substrate 100 is fully heavily doped, where a horizontal coordinate is a frequency (frequency, freq) in units of GHz, and a vertical coordinate is the quality factor (Quality_Factor) of the inductor in dimensionless units. It can be learned that after the substrate 100 is partially lightly doped, the quality factor of the inductor 200 is effectively improved.

In another possible implementation, the resistivity of the substrate may be adjusted by changing a thickness of the substrate 100. Specifically, in the substrate 100, a thickness of a region 1003 directly facing the inductor 200 may be less than a thickness of another region 1004. Therefore, a conductive cross-sectional area of the region 1003 directly facing the inductor 200 is reduced, the resistivity of the substrate 100 at the position is increased, resistance of a coupling current path is increased, and a coupling current generated is reduced. In this way, the quality factor of the inductor 200 can be improved, and performance of the semiconductor device is improved, while the another region 1004 does not directly face the inductor 200 and no coupling current is generated. Therefore, a relatively large thickness can ensure normal working of the semiconductor substrate 100.

Figure 19:
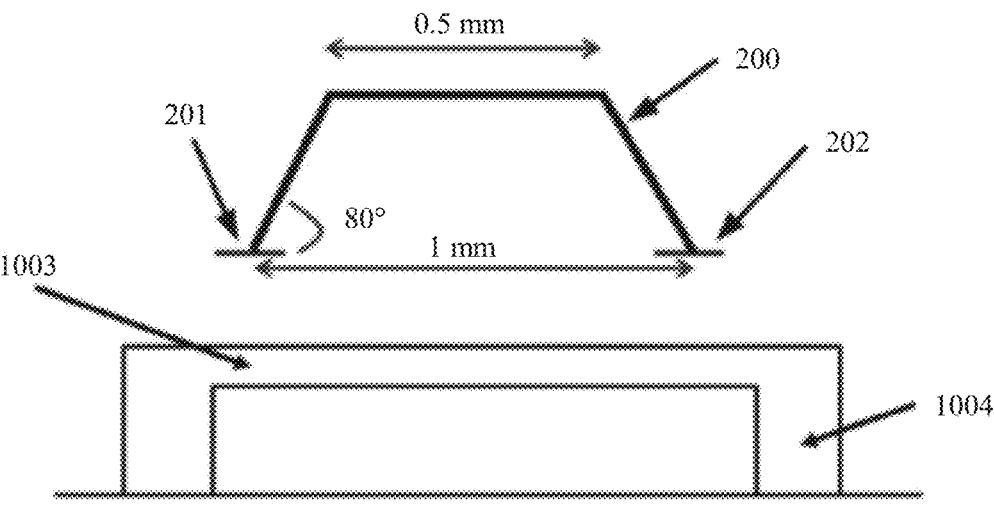
FIG. 19 is a schematic diagram of a structure of still another semiconductor device according to an embodiment of this application.
Figure 20:
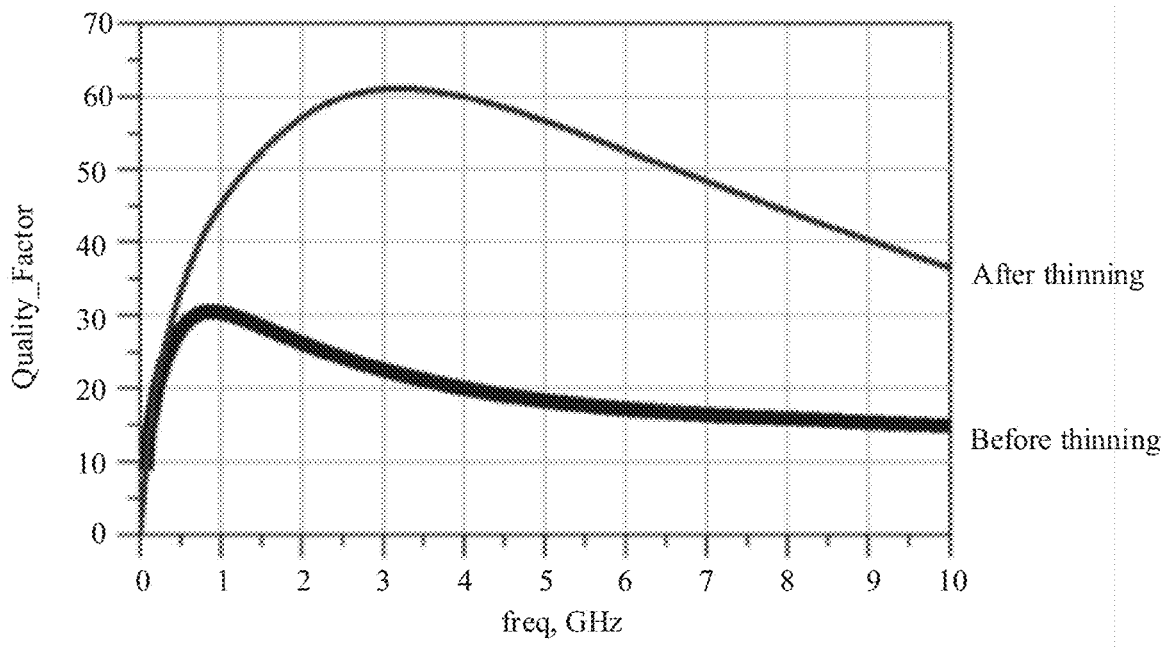
FIG. 20 is a schematic diagram of a quality factor of still another inductor according to an embodiment of this application.

FIG. 19 is a schematic diagram of a structure of still another semiconductor device according to an embodiment of this application. The semiconductor device includes a substrate 100 and an inductor 200. In the substrate 100, a region directly facing the inductor 200 may be a thinned region 1003, and a substrate thickness of the thinned region 1003 may be 10 μm. A substrate thickness of another region 1004 than the thinned region 1003 is 100 μm, and a resistivity may be 0.015 Ω·cm. FIG. 20 is a schematic diagram of a quality factor of still another inductor according to an embodiment of this application, including a comparison between a quality factor of the inductor 200 under a condition that the substrate 100 is partially thinned and a quality factor of the inductor 200 under a condition that the substrate 100 is not partially thinned, where a horizontal coordinate is a frequency (frequency, freq) in units of GHz, and a vertical coordinate is the quality factor (Quality_Factor) of the inductor 200 in dimensionless units. It can be learned that after the substrate 100 is partially thinned, the quality factor of the inductor 200 is effectively improved.

The foregoing example shows that the quality factor of the inductor 200 can be effectively improved by performing partial light doping or partial thinning on the substrate 100. Therefore, in this embodiment of this application, partial light doping and partial thinning can be further performed on a substrate region directly facing the inductor 200. In this way, the quality factor of the inductor 200 can be further improved. Certainly, under a prerequisite that a shield layer 300 is disposed between the substrate 100 and the inductor 200, the region directly facing the inductor 200 may be partially lightly doped and/or partially thinned in the substrate 100, so that the quality factor of the inductor 200 is further improved. For the manners of disposing the shield layer 300, performing partial light doping, and performing partial thinning, refer to the foregoing description. Details are not described herein again.

An embodiment of this application provides a semiconductor device, including a substrate and an inductor, where a shield layer may be formed between the substrate and the inductor, and the shield layer is used to shield an electrical coupling between the substrate and the inductor. In this way, a coupling current in the substrate can be reduced, an energy loss in the inductor is reduced, a quality factor of the inductor is improved, and performance of the semiconductor device is improved.

An embodiment of this application further provides another semiconductor device, including a substrate and a capacitor, where a lower electrode plate 3002 of the capacitor is connected to a ground wire 305 by using conductive through holes 304, or may be connected to the grounded substrate 100 by using conductive through holes 306. Because the lower electrode plate 3002 of the capacitor is grounded by using the conductive through holes, resistance of the conductive through holes causes an energy loss. As a result, a quality factor of the capacitor is reduced, and performance of the semiconductor device is also degraded. Therefore, improving the quality factor of the capacitor can reduce the energy loss in the semiconductor device and also improve the performance of the semiconductor device.

Therefore, in this embodiment of this application, the on-chip capacitor may be in a form of asymmetric capacitor plates. When an area of the grounded lower electrode plate 3002 is greater than an area of an upper electrode plate 3001, the lower electrode plate 3002 can be connected to more conductive through holes. Therefore, equivalent resistance obtained by parallel connection of a plurality of conductive through holes is reduced, an energy loss in the conductive through holes is reduced to some extent, and the quality factor of the capacitor is improved.

An embodiment of this application further provides still another semiconductor device, including a substrate 100 and an inductor 200.

Specifically, in the substrate 10, a doping density of a region 1001 directly facing the inductor 200 is lower than a doping density of another region 1002. Therefore, a resistivity of the region 1001 directly facing the inductor 200 is increased, and a coupling current that can be generated is reduced. In this way, a quality factor of the inductor 200 can be improved, and performance of the semiconductor device is improved, while the another region does not directly face the inductor 200 and no coupling current is generated. Therefore, a relatively high doping density can ensure normal working of the semiconductor substrate. FIG. 17 is a schematic diagram of a structure of still another semiconductor device according to an embodiment of this application. The semiconductor device includes a substrate 100 and an inductor 200. In the substrate 100, a region directly facing an inductor 200 may be a lightly doped region 1001, a substrate resistivity of the lightly doped region 1001 may be 1.5 Ω·cm, an area of the lightly doped region 1001 may be determined based on a directly faced area of the inductor 200, and a depth of the lightly doped region 1001 may be determined based on a feature of the inductor 200 and a distance between the inductor 200 and the substrate. A heavily doped active region 1002 is outside the lightly doped region 1001, and a substrate resistivity of the heavily doped active region 1002 may be 0.015 Ω·cm.

Specifically, in the substrate 100, a thickness of a region 1003 directly facing the inductor 200 may be less than a thickness of another region 1004. Therefore, a conductive cross-sectional area of the region 1003 directly facing the inductor 200 is reduced, a resistivity of the substrate 100 at the position is increased, resistance of a coupling current path is increased, and a coupling current generated is reduced. In this way, the quality factor of the inductor 200 can be improved, and performance of the semiconductor device is improved, while the another region 1004 does not directly face the inductor 200 and no coupling current is generated. Therefore, a relatively large thickness can ensure normal working of the semiconductor substrate 100. FIG. 19 is a schematic diagram of a structure of still another semiconductor device according to an embodiment of this application. The semiconductor device includes a substrate 100 and an inductor 200. In the substrate 100, a region directly facing the inductor 200 may be a thinned region 1003, and a substrate thickness of the thinned region 1003 may be 10 μm. A substrate thickness of another region 1004 than the thinned region 1003 is 100 μm, and a resistivity may be 0.015 Ω·cm.

Figure 21:
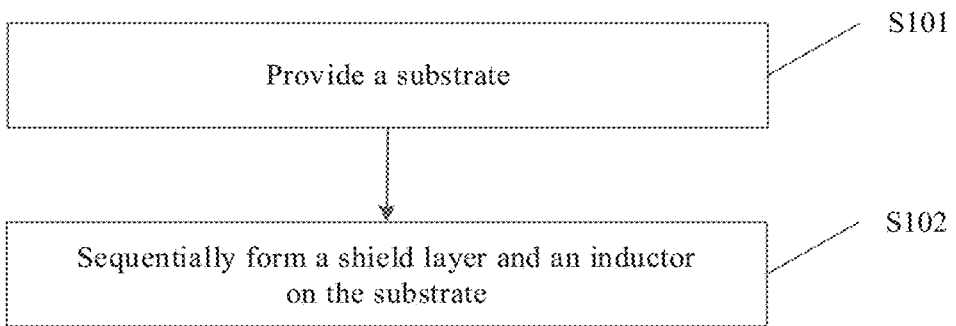
FIG. 21 is a flowchart of a method for manufacturing a semiconductor device according to an embodiment of this application.

Based on the foregoing semiconductor device, an embodiment of this application further provides a method for manufacturing a semiconductor device. FIG. 21 is a flowchart of a method for manufacturing a semiconductor device according to an embodiment of this application. The method may include the following steps.

S101. Provide a substrate.

The substrate 100 may be a semiconductor substrate, for example, a Si substrate, a Ge substrate, a SiGe substrate, a SOI (silicon on insulator, Silicon On Insulator), or a GOI (germanium on insulator, Germanium On Insulator). Certainly, in other embodiments, the substrate 100 may alternatively be a substrate including other element semiconductors or compound semiconductors, such as GaAs, InP, or SiC, or may be a laminated structure, such as Si/SiGe, or may be another epitaxial structure, such as SGOI (silicon germanium on insulator). An isolation region (not shown in the figure) may be formed on the substrate 100. The isolation region may include silicon dioxide or other materials that can separate active regions of the device. In this embodiment, the substrate 100 is a bulk silicon substrate.

S102. Sequentially form a shield layer 300 and an inductor 200 on the substrate.

Optionally, the inductor 200 may be a bonding wire connecting different conductive ports. For example, the inductor 200 may be connected to a signal input end 201 and a signal output end 202. The bonding wire may be a copper wire, a gold wire, an aluminum wire, or the like, or may be another conductive metal wire. The bonding wire usually has a particular length and arc, which determines an inductance value of the bonding wire. A material and diameter of the bonding wire also affect a quality factor of the bonding wire.

Optionally, the inductor 200 may alternatively be a conductor layer with a layered structure. The conductor layer may be connected to the signal input end 201 and the signal output end 202 respectively by using conductive through holes, to form a structure of the inductor 200. The conductor layer may be a metal layer, for example, a tungsten metal layer or a copper metal layer. The conductive through holes may be through holes in which metal materials are formed.

The shield layer 300 may be formed between the substrate 100 and the inductor 200, and the shield layer 300 may isolate the inductor 200 from the substrate 100, thereby shielding an electrical coupling between the substrate 100 and the inductor 200. In this way, a coupling current in the substrate 100 is reduced, a quality factor of the inductor 200 is improved, an energy loss in the semiconductor device is reduced, and performance of the semiconductor device is improved.

In a possible implementation, the shield layer 300 may be a grounded conductor layer or semiconductor layer. The conductor layer may be a metal layer, such as a tungsten metal layer or a copper metal layer. The semiconductor layer may be a laminate of one or more layers of a Si material layer, a Ge material layer, a SiGe material layer, or the like. The shield layer 300 may be grounded by using the bonding wire 301, or may be connected to a ground wire for grounding by using conductive through holes 302 that pass through the substrate 100, or may be connected to the grounded substrate 100 for grounding by using conductive through holes 303.

In another possible implementation, the shield layer 300 may alternatively be another functional layer on the substrate 100, and the another functional layer may be electrically connected to the inductor 200, or may not be electrically connected to the inductor 200. The another functional layer may be, for example, a capacitor formed on the substrate 100. The capacitor may be a plate capacitor. The capacitor has a first electrode plate and a second electrode plate. The second electrode plate may be grounded. The substrate 100 may be close to the first electrode plate, or may be close to the second electrode plate. The second electrode plate may be connected to a ground wire 305 for grounding by using conductive through holes 304, or may be connected to the grounded substrate 100 for grounding by using conductive through holes 306. FIG. 9 is a schematic diagram of still another semiconductor device according to an embodiment of this application. A capacitor may include a first electrode plate and a second electrode plate. The first electrode plate of the capacitor is an upper electrode plate 3001, and the second electrode plate of the capacitor is a lower electrode plate 3002. The lower electrode plate 3002 may be connected to a substrate 100 by using conductive through holes 306, and the substrate 100 may be grounded, so that the second electrode plate is grounded.

To further improve performance of the semiconductor device, the capacitor used as a shield layer 300 may be adjusted to an asymmetric structure. FIG. 15 is a schematic diagram of a structure of still another semiconductor device according to an embodiment of this application. The semiconductor device includes a substrate 100, an inductor 200, and capacitors between the substrate 100 and the inductor 200. One end of the inductor 200 is connected to an upper electrode plate 4001 of a first capacitor. The other end of the inductor 200 is connected to an upper electrode plate 3001 of a second capacitor. The first capacitor and the second capacitor have a common grounded lower electrode plate 3002. Therefore, the two capacitors and the inductor 200 form a n-shaped circuit. In an example, a distance between one end of the inductor 200 and the other end of the inductor 200 is 1 mm, an included angle between one end of the inductor 200 and a surface of the substrate 100 is 80°, and a line segment of the inductor 200 that is parallel to the surface of the substrate 100 is about 0.5 mm.

Specifically, in the substrate 100, a doping density of a region 1001 directly facing the inductor 200 may be lower than a doping density of another region 1002. Therefore, a resistivity of the region 1001 directly facing the inductor 200 is increased, and a coupling current that can be generated is reduced. In this way, a quality factor of the inductor 200 can be improved, and performance of the semiconductor device is improved, while the another region does not directly face the inductor 200 and no coupling current is generated. Therefore, a relatively high doping density can ensure normal working of the semiconductor substrate.

Specifically, in the substrate 100, a thickness of a region 1003 directly facing the inductor 200 may be less than a thickness of another region 1004. Therefore, a conductive cross-sectional area of the region 1003 directly facing the inductor 200 is reduced, a resistivity of the substrate 100 at the position is increased, resistance of a coupling current path is increased, and a coupling current generated is reduced. In this way, the quality factor of the inductor 200 can be improved, and performance of the semiconductor device is improved, while the another region 1004 does not directly face the inductor 200 and no coupling current is generated. Therefore, a relatively large thickness can ensure normal working of the semiconductor substrate 100.

An embodiment of this application provides a method for manufacturing a semiconductor device. A shield layer may be formed between a substrate and an inductor, and the shield layer is used to shield an electrical coupling between the substrate and the inductor. In this way, a coupling current in the substrate can be reduced, an energy loss in the inductor is reduced, a quality factor of the inductor is improved, and performance of the semiconductor device is improved.

An embodiment of this application further provides another method for manufacturing a semiconductor device. The method includes: forming a substrate and a capacitor on the substrate, where a lower electrode plate of the capacitor is connected to a ground wire by using conductive through holes, or may be connected to the grounded substrate by using conductive through holes. Because the lower electrode plate of the capacitor is grounded by using the conductive through holes, resistance of the conductive through holes causes an energy loss. As a result, a quality factor of the capacitor is reduced, and performance of the semiconductor device is also degraded. Therefore, improving the quality factor of the capacitor can reduce the energy loss in the semiconductor device and also improve the performance of the semiconductor device. Therefore, in this embodiment of this application, the on-chip capacitor may be in a form of asymmetric capacitor plates. When an area of the grounded lower electrode plate is greater than an area of an upper electrode plate, the lower electrode plate can be connected to more conductive through holes. Therefore, equivalent resistance obtained by parallel connection of a plurality of conductive through holes is reduced, an energy loss in the conductive through holes is reduced to some extent, and the quality factor of the capacitor is improved.

An embodiment of this application further provides another method for manufacturing a semiconductor device. The method includes: forming a substrate and an inductor on the substrate.

Specifically, in the substrate 100, a doping density of a region 1001 directly facing the inductor 200 is lower than a doping density of another region 1002. Therefore, a resistivity of the region 1001 directly facing the inductor 200 is increased, and a coupling current that can be generated is reduced. In this way, a quality factor of the inductor 200 can be improved, and performance of the semiconductor device is improved, while the another region does not directly face the inductor 200 and no coupling current is generated. Therefore, a relatively high doping density can ensure normal working of the semiconductor substrate. FIG. 17 is a schematic diagram of a structure of still another semiconductor device according to an embodiment of this application. The semiconductor device includes a substrate 100 and an inductor 200. In the substrate 100, a region directly facing an inductor 200 may be a lightly doped region 1001, a substrate resistivity of the lightly doped region 1001 may be 1.5 Ω·cm, an area of the lightly doped region 1001 may be determined based on a directly faced area of the inductor 200, and a depth of the lightly doped region 1001 may be determined based on a feature of the inductor 200 and a distance between the inductor 200 and the substrate. A heavily doped active region 1002 is outside the lightly doped region 1001, and a substrate resistivity of the heavily doped active region 1002 may be 0.015 Ω·cm.

Specifically, in the substrate 100, a thickness of a region 1003 directly facing the inductor 200 may be less than a thickness of another region 1004. Therefore, a conductive cross-sectional area of the region 1003 directly facing the inductor 200 is reduced, a resistivity of the substrate 100 at the position is increased, resistance of a coupling current path is increased, and a coupling current generated is reduced. In this way, a quality factor of the inductor 200 can be improved, and performance of the semiconductor device is improved, while the another region 1004 does not directly face the inductor 200 and no coupling current is generated. Therefore, a relatively large thickness can ensure normal working of the semiconductor substrate 100. FIG. 19 is a schematic diagram of a structure of still another semiconductor device according to an embodiment of this application. The semiconductor device includes a substrate 100 and an inductor 200. In the substrate 100, a region directly facing the inductor 200 may be a thinned region 1003, and a substrate thickness of the thinned region 1003 may be 10 μm. A substrate thickness of another region 1004 than the thinned region 1003 is 100 μm, and a resistivity may be 0.015 Ω·cm.

In this embodiment of this application, partial light doping and partial thinning may be further performed on the substrate region directly facing the inductor. In this way, a quality factor of the inductor can be further improved.

Mutual reference may be made between a plurality of embodiments provided in this application. For example, for the method embodiments, refer to the descriptions of the structural embodiments. The foregoing provides specific implementations of this application. It should be understood that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A semiconductor device, comprising:
a substrate and an inductor, wherein a shield layer is formed between the substrate and the inductor, and wherein the shield layer has a first end that connects to the inductor and the shield layer has a second end that connects to the substrate, and the shield layer shields an electrical coupling between the substrate and the inductor, wherein the shield layer is grounded by using conductive through holes that pass through the substrate that is connected to the shield layer through the second end, and wherein one end of the inductor is connected to an upper electrode plate of a first capacitor and another end of the inductor is connected to an upper electrode plate of a second capacitor, and the first capacitor and the second capacitor have a common grounded lower electrode plate.

2. The semiconductor device according to claim 1, wherein the shield layer is another functional layer in the semiconductor device.

3. The semiconductor device according to claim 2, wherein the shield layer is a capacitor.

4. The semiconductor device according to claim 3, wherein the capacitor has a first electrode plate and a second electrode plate, the second electrode plate is grounded by using conductive through holes, and an area of the second electrode plate is larger than an area of the first electrode plate.

5. The semiconductor device according to claim 1, wherein in the substrate, a doping density of a region directly facing the inductor is lower than a doping density of another region.

6. The semiconductor device according to claim 1, wherein in the substrate, a thickness of a region directly facing the inductor is less than a thickness of another region.

7. The semiconductor device according to claim 1, wherein the inductor is a bonding wire connecting a signal input end and a signal output end, or a conductor layer connecting the signal input end and the signal output end.

8. A radio frequency integrated circuit, comprising:
a substrate and an inductor, wherein
a shield layer is formed between the substrate and the inductor, and wherein the shield layer has a first end that connects to the inductor and the shield layer has a second end that connects to the substrate, and the shield layer shields an electrical coupling between the substrate and the inductor, wherein the shield layer is grounded by using conductive through holes that pass through the substrate that is connected to the shield layer through the second end, and wherein one end of the inductor is connected to an upper electrode plate of a first capacitor and another end of the inductor is connected to an upper electrode plate of a second capacitor, and the first capacitor and the second capacitor have a common grounded lower electrode plate.

9. The radio frequency integrated circuit according to claim 8, wherein the shield layer is a capacitor.

10. The radio frequency integrated circuit according to claim 9, wherein the capacitor has a first electrode plate and a second electrode plate, the second electrode plate is grounded by using conductive through holes, and an area of the second electrode plate is larger than an area of the first electrode plate.

11. The radio frequency integrated circuit according to claim 8, wherein in the substrate, a doping density of a region directly facing the inductor is lower than a doping density of another region.

* * * * *